(12) United States Patent
Yamazaki

(10) Patent No.: US 7,964,879 B2
(45) Date of Patent: Jun. 21, 2011

(54) DISPLAY DEVICE MOUNTED WITH READ FUNCTION AND ELECTRIC APPLIANCE

(75) Inventor: Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 760 days.

(21) Appl. No.: 12/019,222

(22) Filed: Jan. 24, 2008

(65) Prior Publication Data

US 2008/0129653 A1 Jun. 5, 2008

Related U.S. Application Data

(62) Division of application No. 11/179,799, filed on Jul. 13, 2005, now Pat. No. 7,342,256.

(30) Foreign Application Priority Data

Jul. 16, 2004 (JP) .................................. 2004-210103

(51) Int. Cl.
*H01L 27/15* (2006.01)
(52) U.S. Cl. ................ 257/80; 257/79; 257/81; 257/83; 257/89
(58) Field of Classification Search .................... 257/80, 257/79, 81, 83
See application file for complete search history.

(56) References Cited

U.S. PATENT DOCUMENTS

| | | |
|---|---|---|
| 4,806,748 A | 2/1989 | Takami |
| 4,839,634 A | 6/1989 | More |
| 5,446,564 A | 8/1995 | Mawatari |
| 5,627,364 A | 5/1997 | Codama |
| 5,666,438 A | 9/1997 | Beernink |
| 5,920,401 A | 7/1999 | Street |
| 6,040,810 A | 3/2000 | Nishimura |
| 6,087,648 A | 7/2000 | Zhang |
| 6,160,272 A | 12/2000 | Arai |
| 6,188,380 B1 | 2/2001 | Kawashima |
| 6,236,063 B1 | 5/2001 | Yamazaki |
| 6,243,155 B1 | 6/2001 | Zhang |
| 6,287,888 B1 | 9/2001 | Sakakura |
| 6,380,673 B1 | 4/2002 | Sekiya |
| 6,404,137 B1 | 6/2002 | Shodo |
| 6,476,864 B1 | 11/2002 | Borg |
| 6,480,305 B1 | 11/2002 | Resman |
| 6,724,012 B2 | 4/2004 | Kimura |
| 6,747,290 B2 | 6/2004 | Yamazaki |

(Continued)

FOREIGN PATENT DOCUMENTS

JP 10-039791 2/1998

(Continued)

*Primary Examiner* — Long Pham
(74) *Attorney, Agent, or Firm* — Fish & Richardson P.C.

(57) ABSTRACT

According to the present invention, a material having a light-shielding property is used for a bank layer surrounding the edge of a light-emitting element. Accordingly, light which is not reflected by an object to be read out can be prevented from entering an image pick-up element, and information on the object to be read out can be correctly read out. The display device mounted with a read function according to the present invention includes a thin film transistor and an image pick-up element over a substrate having an insulating surface, an insulating layer covering a thin film transistor and an image pick-up element, a light-emitting element provided over the insulating layer, and a bank layer having a light-shielding property surrounding the edge of the light-emitting element. The bank layer has an opening portion in a position overlapping with the image pick-up element.

36 Claims, 13 Drawing Sheets

U.S. PATENT DOCUMENTS

| | | |
|---|---|---|
| 2001/0031074 A1 | 10/2001 | Yamazaki |
| 2002/0011972 A1 | 1/2002 | Yamazaki |
| 2002/0044208 A1 | 4/2002 | Yamazaki |
| 2002/0122123 A1 | 9/2002 | Kimura |
| 2003/0051324 A1 | 3/2003 | Inomata |
| 2003/0189410 A1 | 10/2003 | Yamazaki |
| 2004/0263069 A1 | 12/2004 | Yamazaki |

FOREIGN PATENT DOCUMENTS

| | | |
|---|---|---|
| JP | 2002-176162 | 6/2002 |
| JP | 2004-004708 | 1/2004 |

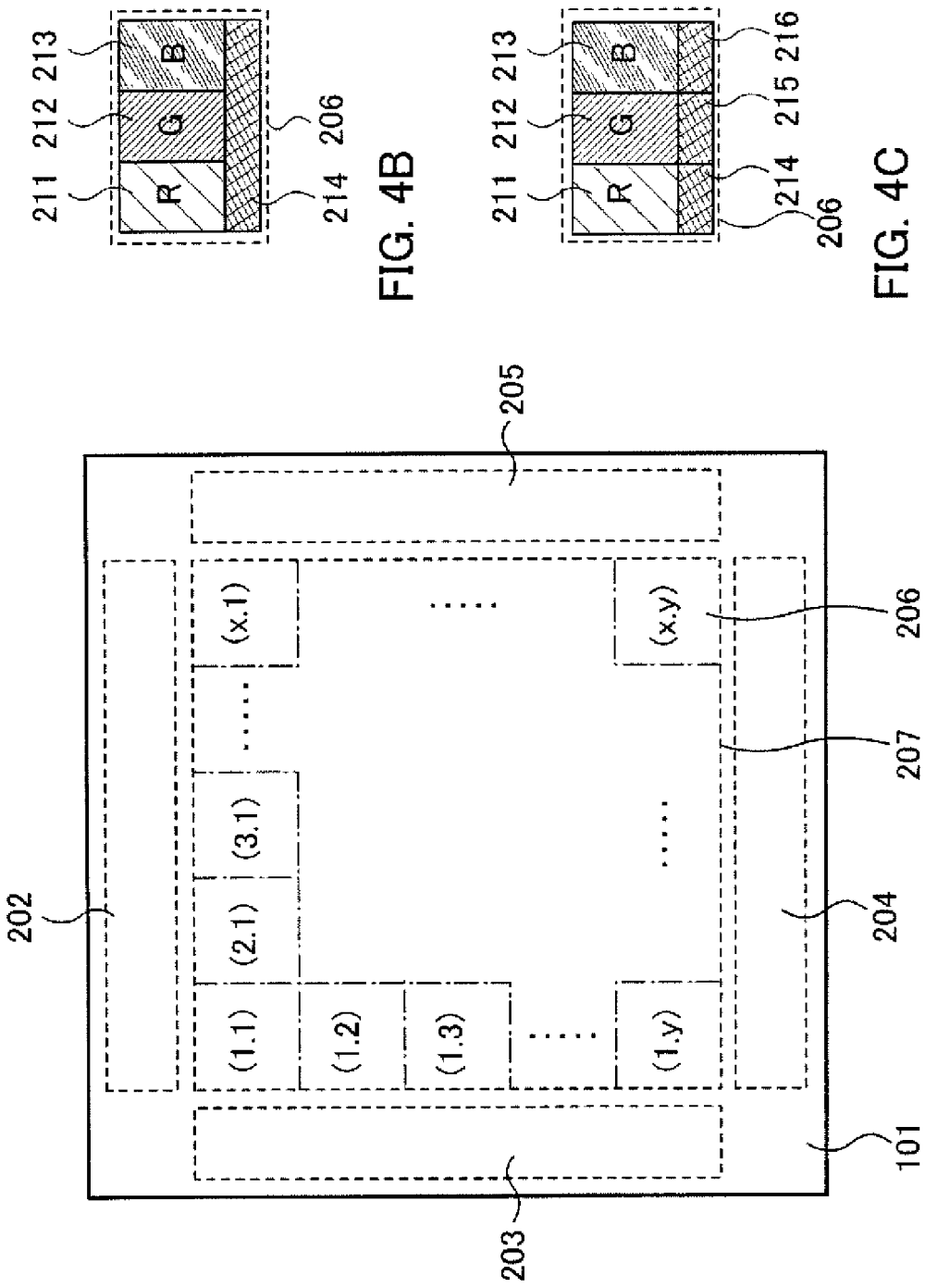

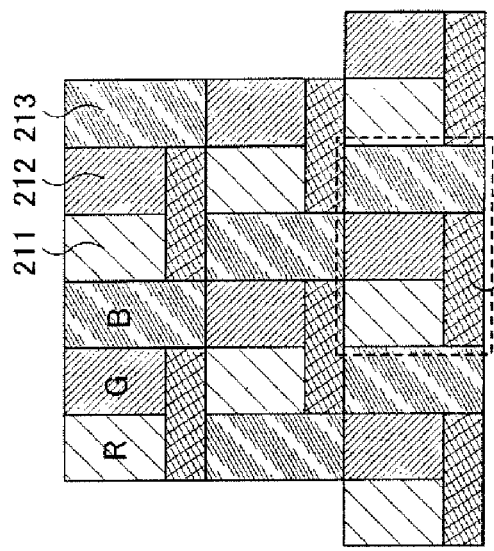
FIG. 7A
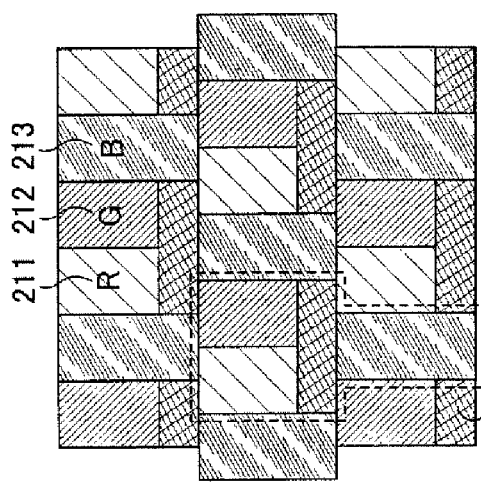
FIG. 7B
FIG. 7C
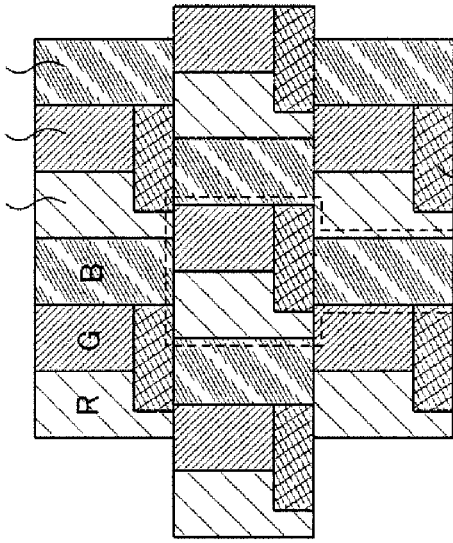
FIG. 7E
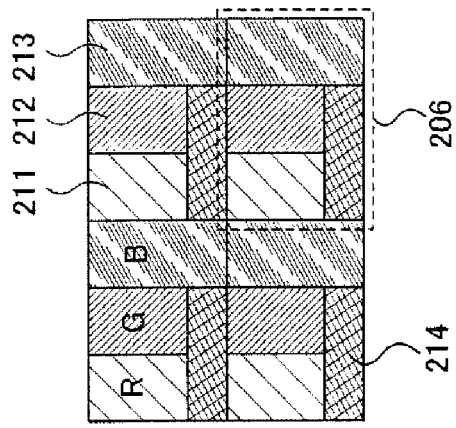
FIG. 7D

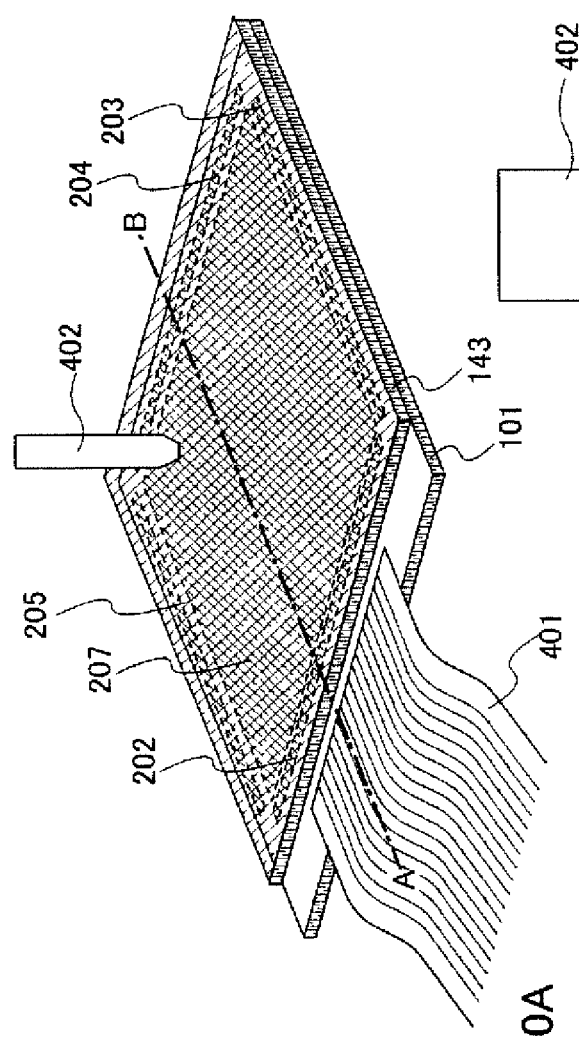
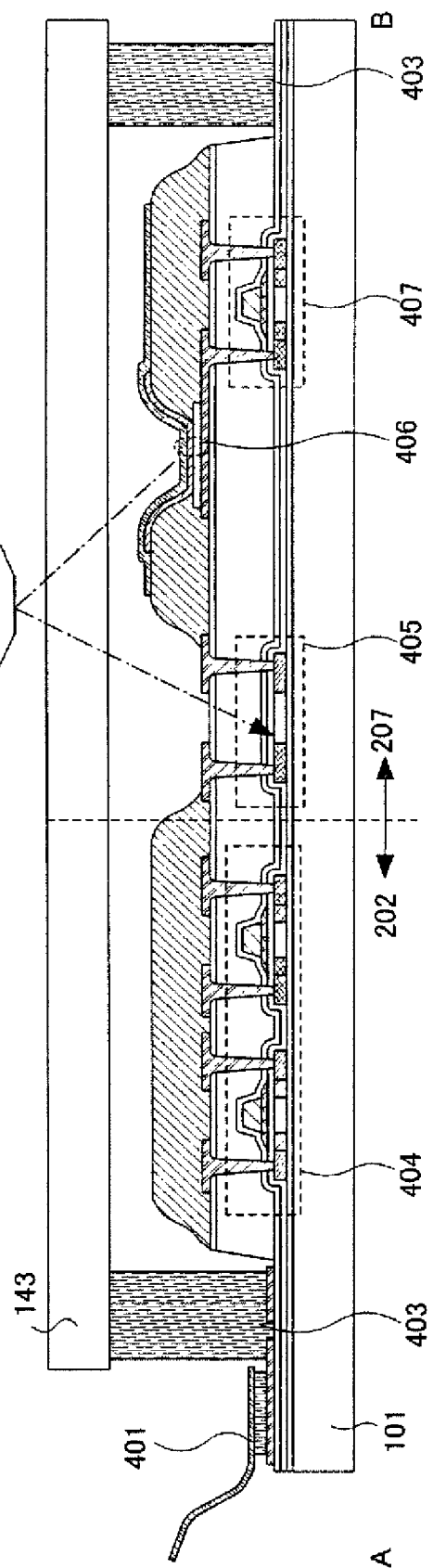
FIG. 10A
FIG. 10B

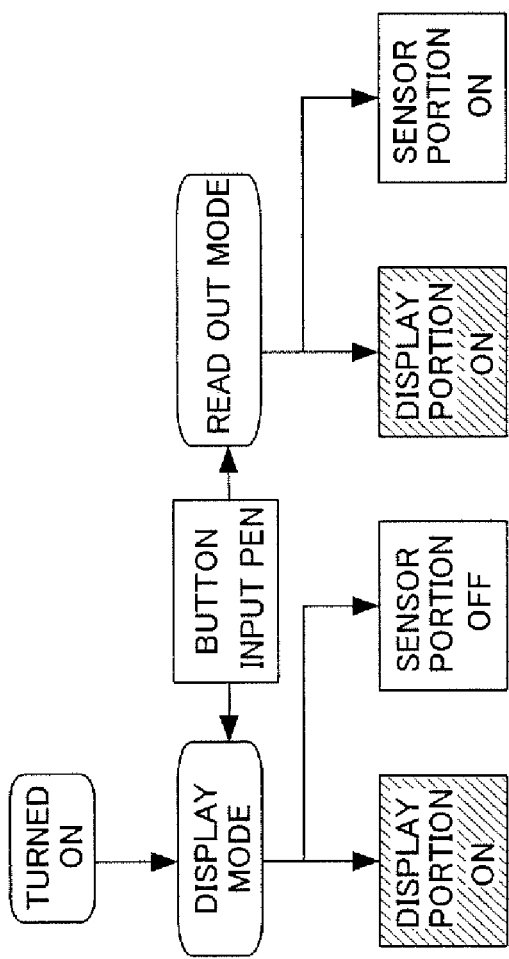
FIG. 12A
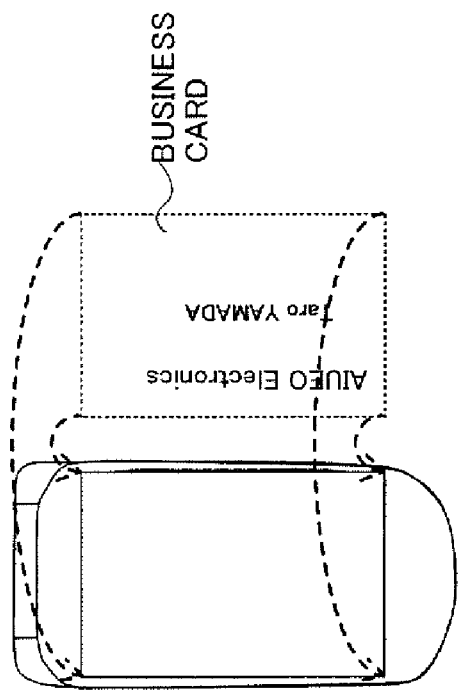
FIG. 12B READ OUT MODE
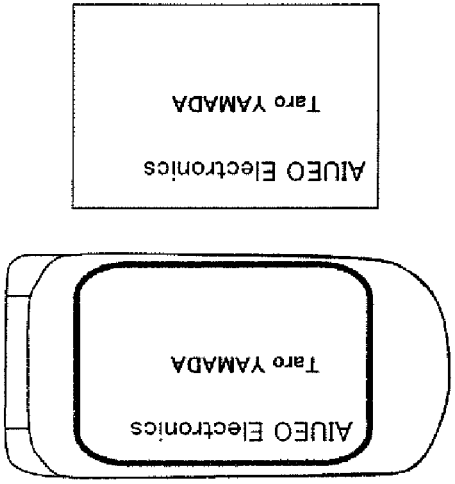
FIG. 12C DISPLAY MODE

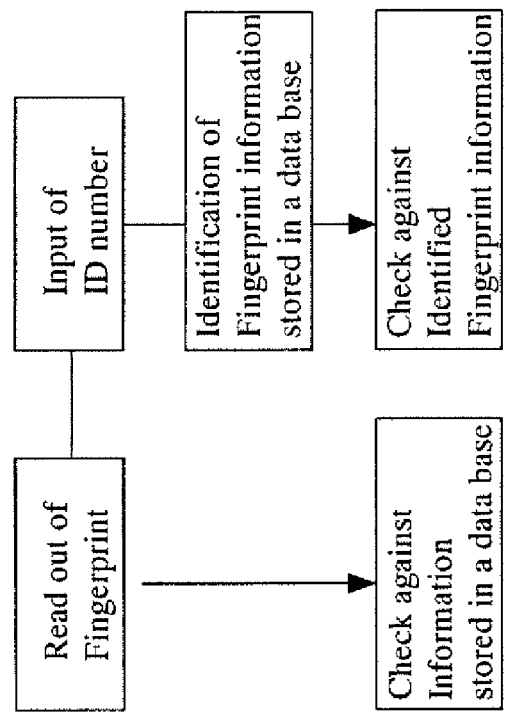
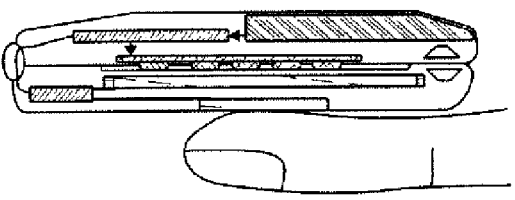
FIG. 13B
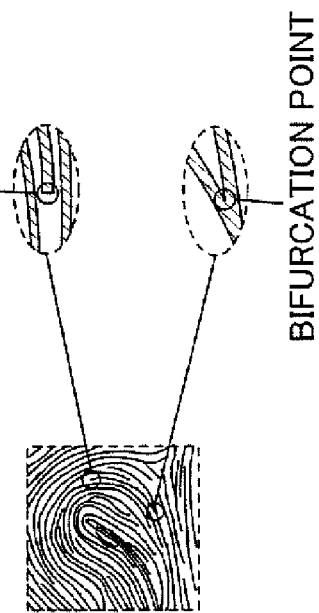
FIG. 13D
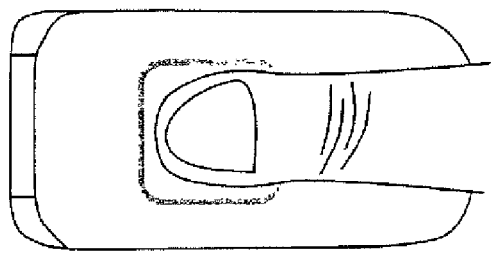
FIG. 13A
FIG. 13C

DISPLAY DEVICE MOUNTED WITH READ FUNCTION AND ELECTRIC APPLIANCE

BACKGROUND OF THE INVENTION

1. Field of the Invention

The present invention relates to a display device mounted with a read function.

Further, the present invention also relates to an electric appliance using the display device mounted with a read function.

2. Related Art

In recent years, a display device using a light-emitting element as typified by an electroluminescent element or the like has been studied as an alternative to a liquid crystal display device. The display device is widely used by taking advantage of a high quality image due to a self luminous type, a wide viewing angle, a thin shape due to no backlight, lightweight, and the like.

There is a display device mounted with a read function which is a display device using the foregoing light-emitting element and which includes not only a light-emitting element but also an image pick-up element over a substrate (for example, refer to Patent document 1). The display device reads out information on an object to be read out in such a way that the image pick-up element receives light which is generated in the light-emitting element and which is reflected by the object to be read out to read out the information.

Patent Document 1: Unexamined Patent Publication No. 2002-176162

Light-emitting materials corresponding to each color required for color display have different current densities for obtaining predetermined luminance from each other. By using light-emitting materials corresponding to light's three primary colors as an example, the luminance of a green light-emitting element is higher than that of a red light-emitting element, the luminance of the red light-emitting element is higher than that of a blue light-emitting element. The foregoing light-emitting material causes variation in luminance of each color. Since white light emission is achieved by emitting all of three sub pixels of red, green, and blue corresponding to light's three primary colors, the white color cannot be clearly displayed depending on how the color of each sub pixel appears. For example, reddish white emission, bluish white emission, or the like is observed. When white balance becomes dulled, desired color cannot be obtained and an image expressed by a correct gray-scale becomes difficult to be displayed. There is an example of improving the white balance by correcting the number of gray-scale of a video signal inputted to three sub pixels of red, green, and blue to eliminate the variation of luminance of each color (for example, refer to patent document 2). Alternatively, there is an example of improving the white balance by varying power source potential given to each sub pixel instead of correcting a video signal.

Patent Document 2: Unexamined Patent Publication No. 2004-004708

According to the structure disclosed in the patent document 1, light may not be reflected by the object to be read out but be entered into the image pick-up element. This arises from the fact that light generated in the light-emitting element is reflected by an interface between a certain medium (for example, an insulating layer) and another certain medium between the light-emitting element and the object to be read out, and the reflected light is entered the image pick-up element. Only light reflected by the object to be read out should enter the light entering the image pick-up element. When such the extra light enters the image pick-up element, information on the object to be read out cannot be read out correctly.

According to the structure disclosed in patent document 2, a signal correction circuit for correcting the number of gray-scale of a video signal is required to be newly provided. When the number of ICs connected to the outside is increased as the signal correction circuit, the ICs interfere with the reduction of a size, a thickness, and weight. When a power source potential given to each sub pixel is varied to improve the white balance, it is required to generate some electrical potentials based on the power source potential supplied from a power source circuit; consequently, a circuit such as a level shifter is required to be provided. When the level shifter is not provided, various power source potentials are required to be provided from the outside; consequently, the number of pins of a panel is required to be increased.

SUMMARY OF THE INVENTION

In view of the foregoing, it is an object of the present invention to provide a display device mounted with a read function capable of reading out information on an object to be read out.

In view of the foregoing, it is an object of the present invention to provide a display device mounted with a read function which improves white balance by improving the variation of luminance of each color without correcting a video signal or increasing a power source potential.

According to the present invention, a material having a light-shielding property is used for a bank layer surrounding the edge of a light-emitting element. Accordingly, light which is not reflected by an object to be read out can be prevented from entering an image pick-up element, and so information on the object to be read out can be correctly read out.

The display device mounted with a read function according to the present invention includes a thin film transistor and an image pick-up element over a substrate having an insulating surface, an insulating layer covering a thin film transistor and an image pick-up element, a light-emitting element provided over the insulating layer, and a bank layer having a light-shielding property surrounding the edge of the light-emitting element. The bank layer has an opening portion in a position overlapping with the image pick-up element.

The display device mounted with a read function according to the present invention includes a thin film transistor and an image pick-up element over a substrate having an insulating surface, an insulating layer covering a thin film transistor and an image pick-up element, a white light-emitting element provided over the insulating layer, a bank layer having a light-shielding property surrounding the edge of a white light-emitting element, and a coloring layer provided to an upper part of the bank layer to overlap with the white light-emitting element. The bank layer has an opening portion in a position overlapping with the image pick-up element. The coloring layer is characterized in not being provided in a position overlapping the image pick-up element.

The display device mounted with a read function according to the present invention includes a plurality of pixels over a substrate having an insulating surface. Each of the plurality of pixels includes a first sub pixel having a first light-emitting element exhibiting red emission, a second sub pixel having a second light-emitting element exhibiting green emission, a third sub pixel having a third light-emitting element exhibiting blue emission, and a fourth sub pixel having an image pick-up element. An insulating layer is provided over the image pick-up element. The first to third light-emitting elements are provided over the insulating layer. A bank layer having a light-shielding property is provided so as to surround the edges of the first to third light-emitting elements. The bank layer has an opening portion in a position overlapping with the image pick-up element.

The display device mounted with a read function according to the present invention includes a plurality of pixels over a substrate having an insulating surface. Each of the plurality of pixels includes a first sub pixel having a first light-emitting element exhibiting red emission, a second sub pixel having a second light-emitting element exhibiting green emission, a third sub pixel having a third light-emitting element exhibiting blue emission, a fourth sub pixel having a first image pick-up element, a fifth sub pixel having a second image pick-up element, and a sixth image pick-up element having a third image pick-up element. An insulating layer is provided over the first to third image pick-up elements. The first to third light-emitting elements are provided over the insulating layer. A bank layer having a light-shielding property is provided so as to surround the edges of the first to third light-emitting elements. The bank layer has an opening portion in a position overlapping with the image pick-up element.

The image pick-up element included in the foregoing display device mounted with a read function has a crystalline semiconductor. Further, the image pick-up element included in the foregoing display device mounted with a read function has a P-type region, an I-type region, and an N-type region.

The present invention is characterized in the variation of the area of a sub pixel including a light-emitting element over a substrate. The first structure is formed by decreasing the area of a green sub pixel to less than that of a red sub pixel or a blue sub pixel. A sub pixel having an image pick-up element is formed in an extra area thus obtained of the green sub pixel. The second structure is formed by decreasing the areas of the red and green sub pixels to less than that of the blue sub pixel. Then, a sub pixel having an image pick-up element is formed in an extra area thus obtained of the red and green sub pixels.

According to the foregoing structures, even when the current densities of the light-emitting material of red, green, and blue are different from each other, the variation of luminance in each color can be improved by varying the emitting area tp improve the white balance. An extra sub pixel including an image pick-up element is not provided, but the area of a sub pixel including a light-emitting element is reduced to improve white balance. Subsequently, an image pick-up element is provided in an extra region produced by reducing the area of the sub pixel. Therefore, integration degree as much as that in the case of not including the image pick-up element can be kept even if the sub pixel including an image pick-up element is provided, and so high-definition images can be displayed despite providing the image pick-up element.

The display device mounted with a read function according to the present invention includes a plurality of pixels over a substrate having an insulating surface. Each of the plurality of pixels includes a first sub pixel having a light-emitting element exhibiting red emission, a second sub pixel having a light-emitting element exhibiting green emission, a third sub pixel having a light-emitting element exhibiting blue emission, and a fourth sub pixel having an image pick-up element. Over the substrate, the area of the first sub pixel is the same as that of the third sub pixel, and that the total area of the second sub pixel and the fourth sub pixel is the same as that of the first sub pixel or the third sub pixel.

The display device mounted with a read function according to the present invention includes a plurality of pixels over a substrate having an insulating surface. Each of the plurality of pixels includes a first sub pixel having a light-emitting element exhibiting red emission, a second sub pixel having a light-emitting element exhibiting green emission, a third sub pixel having a light-emitting element exhibiting blue emission, and a fourth sub pixel having an image pick-up element, and that the total area of the first sub pixel, the third sub pixel, and the fourth sub pixel are twice as large as the area of the second sub pixel.

The plurality of pixels is characterized in being arranged in a striped pattern. The plurality of pixels is characterized in being arranged in a deltoid pattern. The plurality of pixels is characterized in being arranged in a mosaic pattern.

The display device mounted with a read function according to the present invention can read out correctly information on an object to be read out since a bank layer has a light-shielding property capable of preventing extra light from entering an image pick-up element.

The variation of luminance of each color can be improved by varying the area of each sub pixel; accordingly, white balance can be improved. Further, an image pick-up element can be provided in an extra area produced by varying the area of each sub pixel, integration degree as much as that in the case of not including the image pick-up element can be kept. Therefore, high resolution images can be displayed despite providing the image pick-up element.

These and other objects, features and advantages of the present invention will become more apparent upon reading of the following detailed description along with the accompanied drawings.

BRIEF DESCRIPTION OF THE DRAWINGS

FIGS. 4A to 4C are explanatory views for showing a structure of a display device mounted with a read function according to the present invention;

FIGS. 7A to 7E are explanatory views for showing a structure of a display device mounted with a read function according to the present invention;

FIGS. 10A and 10B are explanatory views for showing a panel;

FIGS. 12A to 12C are explanatory views for showing usage patterns of a display device mounted with a read function according to the present invention; and FIGS. 13A to 13D are explanatory views for showing usage patterns of a display device mounted with a read function according to the present invention.

DESCRIPTION OF THE INVENTION

Embodiments according to the present invention are explained in detail with reference to the drawings. Through the drawings of the embodiments, like components are denoted by like numerals as of these embodiments with each other and will not be further explained.

Embodiment 1

In order to explain the structure of a display device mounted with a read function, the manufacturing process thereof is firstly explained.

Figure 1:
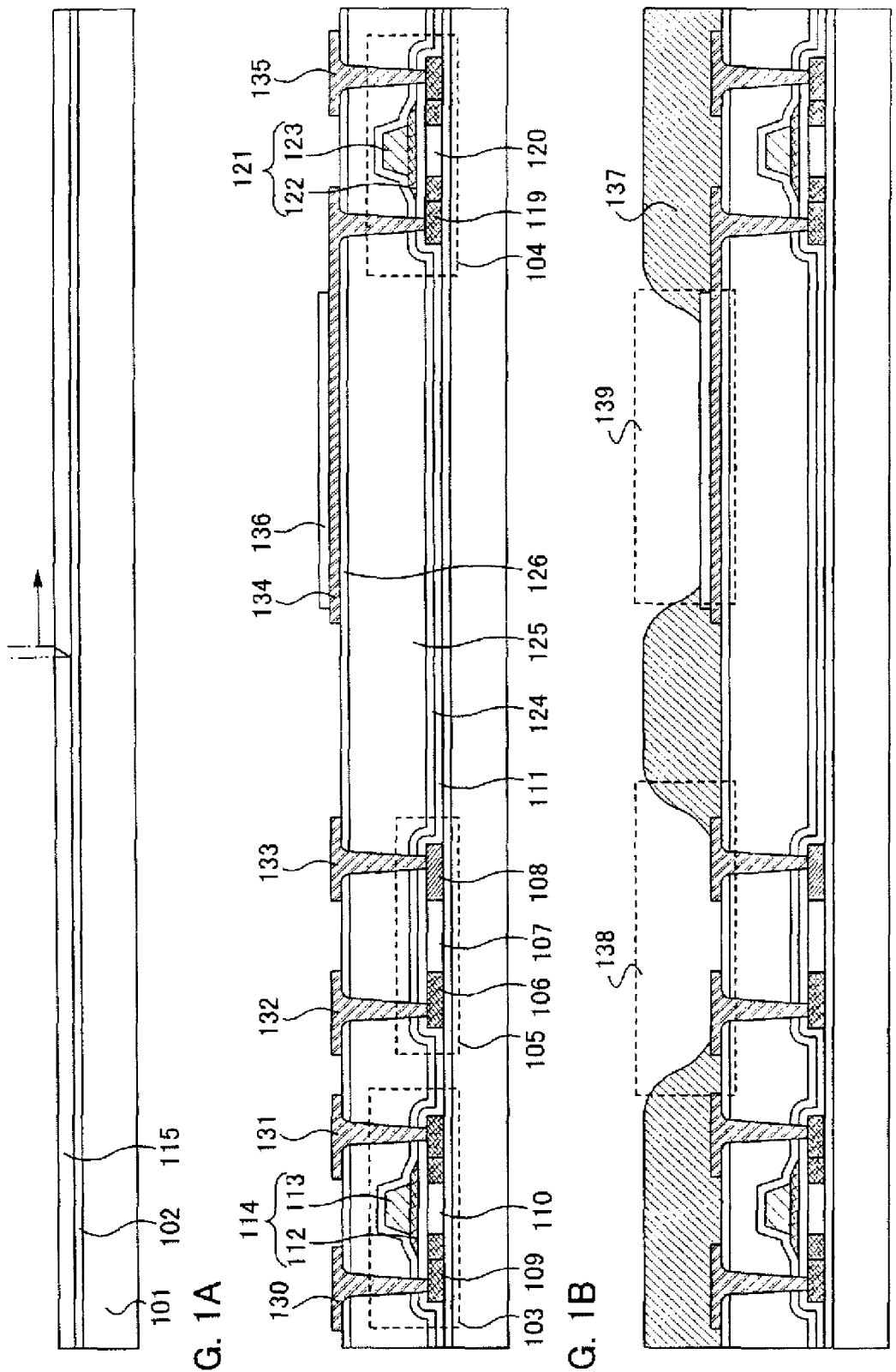
FIGS. 1A to 1C are explanatory views for showing a structure of a display device mounted with a read function according to the present invention.

An insulating layer 102 serving as a base layer is formed over a substrate 101 having an insulating surface (FIG. 1A). As the substrate 101, a glass substrate, a quartz substrate, a silicon substrate, or a plastic substrate having heat resistance that can withstand process temperature is used.

An amorphous semiconductor layer is formed on the insulating film 102 by a known method (a sputtering method, a plasma CVD method, or the like). Then, a crystalline semiconductor layer 115 is formed by crystallizing the amorphous semiconductor layer by a known crystallization method (a laser crystallization method, a thermal crystallization method, a thermal crystallization method using a catalyst such as nickel).

Then, the crystallization semiconductor layer 115 is pattern processed to form an island-like crystalline semiconductor layer. And then, predetermined processes such as a film formation process of a thin film, an etching process, and a doping process are performed to form thin film transistors 103, 104, and an image pick-up element 105 (FIG. 1B). Semiconductor layers included in the thin film transistors 103, 104, and the image pick-up element 105 are crystalline semiconductor layers and formed over the insulating layer 102. As just described, the image pick-up element 105 can be formed over the substrate 101 without adding a new mask by making the image pick-up element 105 include a crystalline semiconductor layer as with the thin film transistors 103, 104.

Without being restricted by the foregoing structure, an amorphous semiconductor layer or a microcrystalline semiconductor layer having excellent optical conductivity may be used as the semiconductor layer included in the image pick-up element 105. In the case that an amorphous semiconductor layer is formed as the semiconductor layer included in the image pick-up element 105 and crystalline semiconductor layers are formed as the semiconductor layers included in the thin film transistors 103, 104, the crystallinity of the semiconductor layers in the image pick-up element 105 and thin film transistors 103, 104 are different from each other, and so these semiconductor layers are required to be formed individually. Therefore, a new mask is required to be added.

In order to form semiconductor layers having different crystallinity, a process of performing selectively laser light irradiation may be used instead of a process of adding a new mask.

The thin film transistor 103 has a crystalline semiconductor layer including an impurity region 109 and a channel formation region 110, a gate insulating layer 111, and conductive layers 112, 113 serving as a gate electrode 114. The thin film transistor 103 controls the operation of the image pick-up element 105. The thin film transistor 104 has a crystalline semiconductor layer including an impurity region 119 and a channel formation region 120, a gate insulating layer 111, and conductive layers 122, 123 serving as a gate electrode 121. The thin film transistor 104 controls the operation of a light-emitting element 142 to be formed later. The gate electrodes of the thin film transistor 103, 104 are made from conductive materials into single layers or laminated layers. For example, a laminated layer structure composed of tungsten (W)/tungsten nitride (WN) (the ratio between the tungsten and the nitrogen is not limited), molybdenum (Mo)/aluminum (Al)/Mo, or Mo/molybdenum nitride (MoN) (the ratio between the molybdenum (Mo) and nitrogen (N) is not limited) may be adopted.

The image pick-up element 105 has a P-type region 106, an I-type region 107, and an N-type region 108. The P-type region 106, the I-type region 107, and the N-type region 108 are provided to be neighbored each other transversely. The image pick-up element 105 having the P-type region 106, the I-type region 107, and the N-type region 108 is a photovoltaic element that generates an electromotive force by a photoeffect of a semiconductor. However, not only the photovoltaic element but also a photoconductive element that changes electric resistance by light can be used as the image pick-up element 105. In the case of using the photoconductive element, the image pick-up element 105 includes the P-type region, the I-type region, and the P-type region; or the N-type region, I-type region, and the N-type region.

Insulating layers 124 to 126 are formed so as to cover the thin film transistors 103, 104, and the image pick-up element 105. The insulating layers 124 to 126 are made from an inorganic material such as silicon oxide or silicon nitride, an organic material such as polyimide or acrylic, or the like. As the organic material, a siloxane based material may be used. The siloxane is composed of a skeleton formed by the bond of silicon (Si) and oxygen (O), in which an organic group containing at least hydrogen (such as an alkyl group or aromatic hydrocarbon) is included as a substituent. Alternatively, a fluoro group may be used as the substituent. Further alternatively, a fluoro group and an organic group containing at least hydrogen may be used as the substituent.

Opening portions are formed in the insulating layers 124 to 126. Then, conductive layers 130 to 135 for filling the opening portions are formed. The conductive layers 130 to 135 serve as source drain wirings (a source wiring or a drain wiring). The conductive layers 130 to 135 may be formed to have a lamination structure composed of titanium (Ti)/aluminum silicon (Al—Si) (aluminum added with silicon (Si))/Ti, Mo/Al—Si/Mo, or MoN/Al—Si/MoN. Alternatively, a material containing aluminum as its main component including nickel, or an alloy material including nickel and either or both of carbon and silicon may be used.

A conductive layer 136 is formed on the conductive layer 134. The conductive layer 136 serves as a pixel electrode of the light-emitting element. As the conductive layer 136, indium tin oxide (ITO) transparent to light, ITO added with silicon oxide, indium zinc oxide (IZO), zinc oxide added with gallium (GZO), or the like may be used.

A bank layer 137 is formed so as to cover the conductive layers 130 to 136 (FIG. 1C). Two opening portions 138, 139 are formed in the bank layer 137. The opening portion 138 is formed to cover the image pick-up element 105. The other opening portion 139 is formed to expose the conductive layer 136. The bank layer 137 has a light shielding property, which is formed by a spin coating method using a material prepared by adding and stirring carbon particles, metal particles, pigment, coloring materials, or the like. When carbon particles or metal particles are added to the organic materials, a surface active agent or a dispersing agent may be added thereto to mix the carbon particles or the metal particles uniformly.

Figure 2:
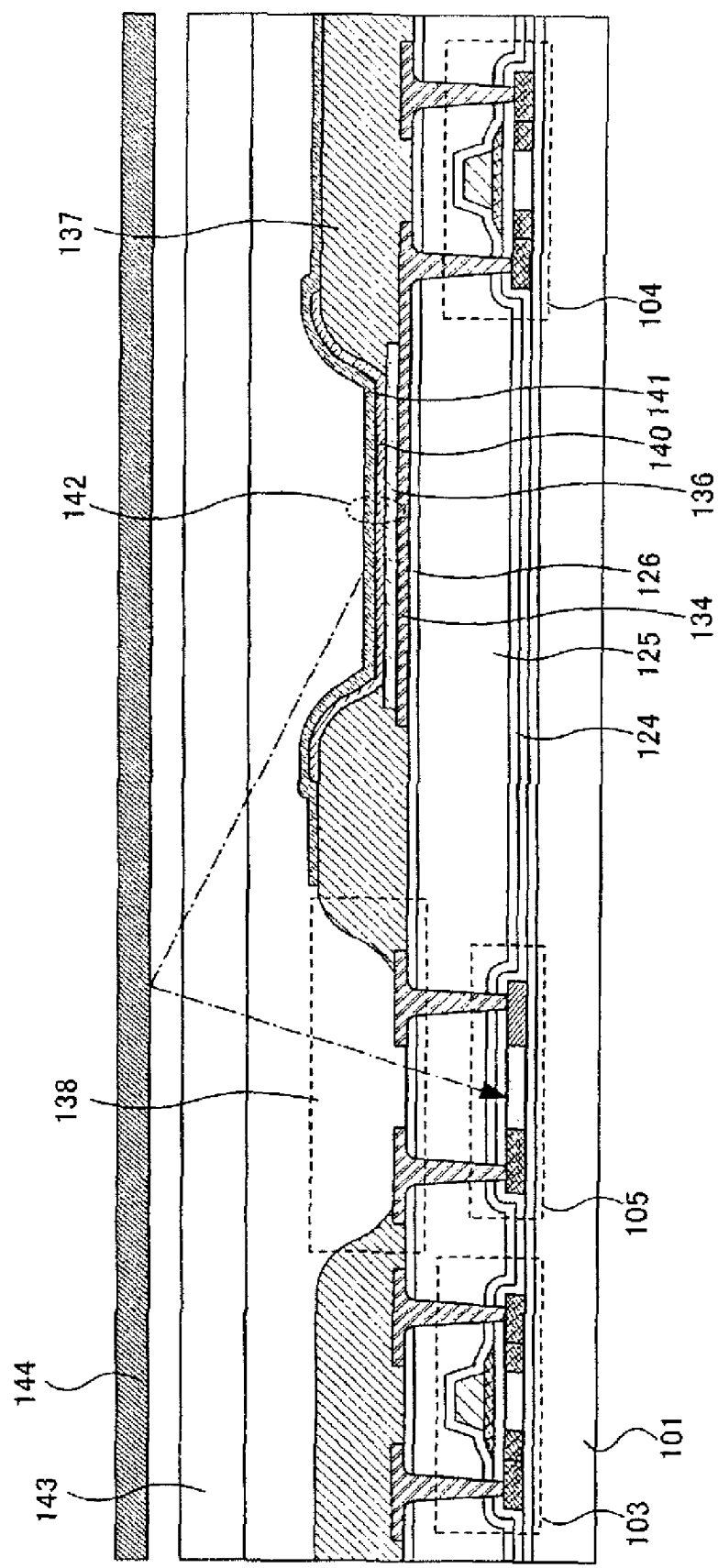
FIG. 2 is an explanatory view for showing a structure of a display device mounted with a read function according to the present invention.

An electroluminescent layer 140 is formed on the conductive layer 136 (FIG. 2). Then, a conductive layer 141 is formed on the electroluminescent layer 140. The conductive layer 141 serves as an opposing electrode. A laminated body of the conductive layer 136, the electroluminescent layer 140, and a conductive layer 141 are equivalent to a light-emitting element 142. An opposing substrate that is opposed to the substrate 101 is provided. An optical film such as a circular polarizing plate can be provided over one surface of the substrate 101 and one surface of the opposing substrate 143.

The display device mounted with a read function according to the present invention completed though the foregoing processes has a display function and a read function. When utilizing the display function, an image is displayed by lighting (emitting) or non-lighting (non-emitting) the light-emitting element 142 in the direction of the opposing substrate 143 to make light that is reflected by an object to be read 144 enter into the image pick-up element 105. Accordingly, the information on the object to be read 144 is read.

The display device mounted with a read function according to the present invention mainly has the thin film transistors 103, 104, and the image pick-up element 105 over the substrate 101 having an insulating surface; the insulating layers 124 to 126 covering the thin film transistors 103, 104, and the image pick-up element 105; the light-emitting element 142 formed over the insulating layers 124 to 126; and the bank layer 137 with a light-shielding property surrounding the edge of the light-emitting element 142. The bank layer 137 has the opening portion 138 in a position overlapping with the image pick-up element 105.

According to the present invention, light that is not reflected by the object to be read 144 is prevented from entering the image pick-up element 105 by using a material having a light-shielding property as the bank layer 137 surrounding the edge of the light-emitting element. Further, since the bank layer 137 has the opening portion in the position overlapping with the image pick-up element 105, the light reflected by the object to be read 144 can enter the image pick-up element 105 without being absorbed by the bank layer 137 having a light-shielding property to read the information on the object to be read 144.

As noted above, in the case that the bank layer 137 has a light-shielding property, a high-resolution image can be displayed since outlines of pixels (boundaries between pixels) become clarified. Further, reflected light entered from the outside is reduced to prevent reflected glare, and so an optical film such as a polarized plate becomes not required, which leads to reduce the size, thickness, and weight.

Although the direction of light emitted from the light-emitting element 142 is not especially limited, top emission, that is, light generated in the light-emitting element 142 is emitted toward the opposing substrate 143, or dual emission, that is, light generated in the light-emitting element 142 is emitted toward both of the substrate 101 and the opposing substrate 143, is constructive from the fact that unwanted light is reduced or removed by forming the bank layer 137 to have a light-shielding property. Bottom emission, that is, light generated in the light-emitting element 142 is emitted to the direction of the substrate 101, may be used although it has less effects than those of the top emission and the dual emission.

In the case of top emission in which the thin film transistor 104 for controlling the operation of the light-emitting element 142 has the conductivity of N-type (N-channel type), the light-emitting element 142 is formed to have a reverse structure in which a pixel electrode serves as a cathode and an opposing electrode serves as an anode. In the case that the thin film transistor has the conductivity of P-type (P-channel type), the light-emitting element 142 is formed to have a forward structure in which the pixel electrode serves as an anode and the opposing electrode serves as a cathode. In that case, a reflector is provided at the bottom of the pixel electrode to make light generated in the light-emitting element 142 go to the side of the opposing substrate 143. The cross-sectional structure in FIG. 2 adopts the foregoing structure in which a conductive layer 134 serving as a reflector is provided at the bottom of the conductive layer 136 serving as the pixel electrode of the light-emitting element 142.

In the case of dual emission, both of the pixel electrode and the opposing electrode of the light-emitting element 142 are made from a material having a light-transmitting property or alternatively formed to have a thickness capable of transmitting light.

In the case of bottom emission in which the thin film transistor 104 has the conductivity of N-type, the light-emitting element 142 is formed to have a reverse structure in which the pixel electrode serves as a cathode and the opposing electrode serves as an anode. In that case, a reflector is provided at the top of the opposing electrode to make light generated in the light-emitting element 142 go to the side of the substrate 101. In the case that the thin film transistor 104 has the conductivity of P-type, the light-emitting element 142 is formed to have a forward structure in which the pixel electrode 142 is formed by an anode and the opposing electrode is formed by a cathode.

The display device mounted with a read function according to the present invention is not limited to use a light-emitting element that emits red emission, green emission, or blue emission. The device can use a white light-emitting element and a coloring layer, or a blue light-emitting element and a color conversion layer. A cross-sectional structure of a display device mounted with a read function using the white light-emitting element and the coloring layer is explained with reference to the drawing.

Figure 3:
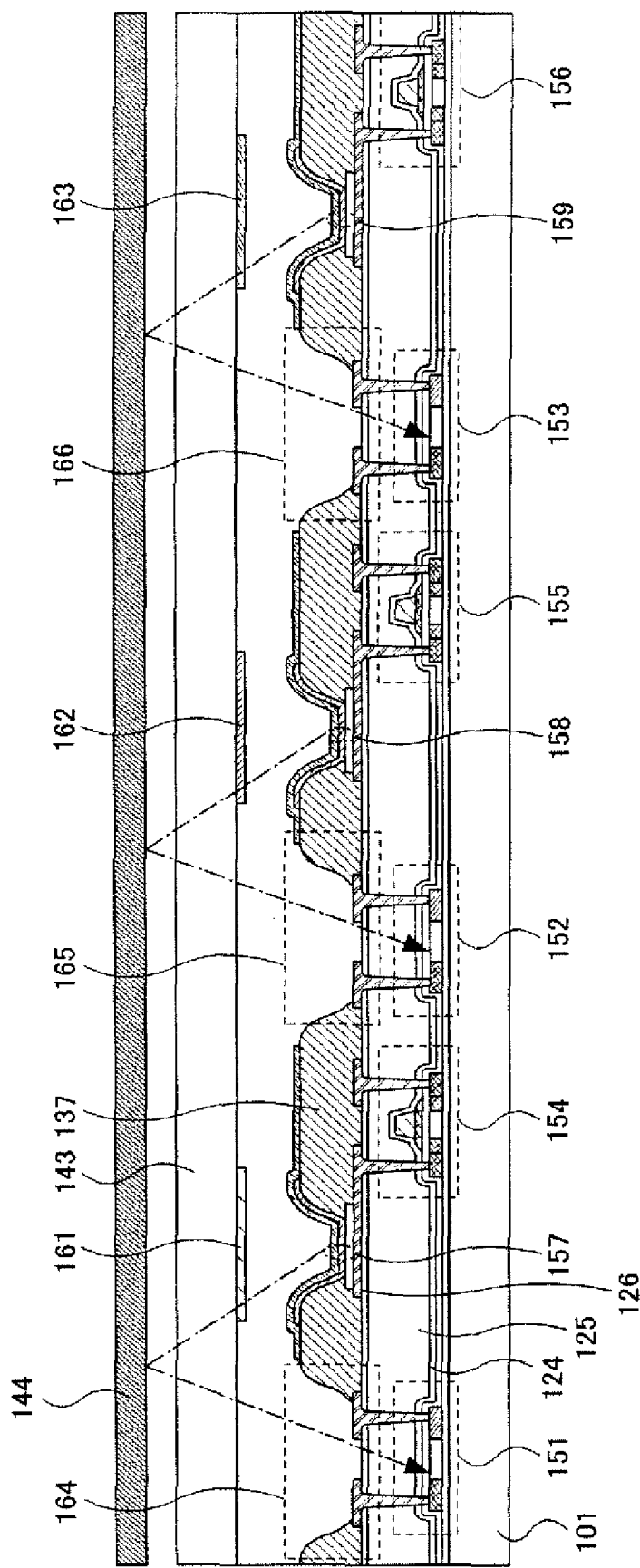
FIG. 3 is an explanatory view for showing a structure of a display device mounted with a read function according to the present invention.

Image pick-up elements 151 to 153 and thin film transistors 154 to 156 are provided over the substrate 101, and insulating layers 124 to 126 are provided so as to cover the image pick-up elements 151 to 153 and the thin film transistors 154 to 156 (FIG. 3). White light-emitting elements 157 to 159 are provided over the insulating layers 124 to 126, and a bank layer 137 surrounding the edges of the white light-emitting elements 157 to 159 is formed. The bank layer 137 has opening portions 164 to 166 in a position of overlapping the image pick-up elements 151 to 153.

An opposing substrate 143 having coloring layers 161 to 163 is provided so as to oppose to the substrate 101. Each of the coloring layers 161 to 163 corresponds to red, blue, or green. The white light-emitting elements 157 to 159 exhibit any one of red, green, and blue via any one of the coloring layers 161 to 163.

In the case of using the blue light-emitting element and the color conversion layer, blue light-emitting elements may be used instead of the white light-emitting elements 157 to 159, and the color conversion layers may be used instead of the coloring layers 161 to 163.

In the foregoing structure, light emitted from each of the white light-emitting elements 157 to 159 passes through each of the coloring layers 161 to 163 to reach the surface of the object to be read 144. Light reflected by the surface of the object to be read 144 is received by each of the image pick-up elements 151 to 153 to read out information on the object to be read 144.

By forming a light-emitting element to have a coloring layer or a color conversion layer transmitting light at a certain wavelength band at the light output side of the light-emitting element like the foregoing structure, color purity can be improved and the pixel portion can be prevented from being a mirror surface (reflected glare). Further, the coloring layer or the color conversion layer makes it possible to omit a circular polarizing plate or the like which is required conventionally, consequently, loss of light emitted from the electroluminescent layer can be eliminated. Further, the change of color occurred in the case of viewing obliquely can be reduced. In the case of using the white light-emitting element or the blue light-emitting element, the patterning of an electroluminescent layer is not required, and so the process of patterning can be shortened to reduce the cost.

The structure of the display device mounted with a read function according to the present invention having a cross-sectional structure illustrated in FIGS. 1A to 3 is explained with reference to the drawings.

A display device mounted with a read function according to the present invention includes a source driver 202, a gate driver 203, a sensor source driver 204, a sensor gate driver 205, a pixel region 207 provided with a plurality of pixels 206 in a matrix configuration over a substrate 101 having an insulating surface 101 (FIG. 4A). The pixel 206 includes a plurality of sub pixels composed of at least a sub pixel with a light-emitting element and a sub pixel with an image pick-up element. The source driver 202 and the gate driver 203 control the operation of the sub pixel having the light-emitting element, whereas the sensor source driver 204 and the sensor gate driver 205 control the operation of the sub pixel with the image pick-up element.

The pixel 206 is formed to have various structures, for example, the pixel 206 may be formed to include a first sub pixel 211 with a first light-emitting element exhibiting red emission, a second sub pixel 212 with a second light-emitting element exhibiting green emission, a third sub pixel 213 with a third light-emitting element exhibiting blue emission, and a fourth sub pixel 214 with an image pick-up element (FIG. 4B). Each of the first to fourth sub pixels 211 to 214 includes a thin film transistor for controlling the light-emitting element or the image pick-up element.

In the case of having the foregoing structure, every time a lighting sub pixel is switched, an image is read out. Thereafter, the read out information is synthesized to obtain colored information on the object to be read out. Specifically, the first sub pixel 211 is lighted, and information on the object to be read out is read out by the fourth sub pixel 214, lastly, the third sub pixel 213 is lighted to read out the information on the object to be read out by the fourth sub pixel 214. When synthesizing three pieces of the read out information, the colored information on the object to be read out can be obtained. In the case of the structure, colored information on the object to be read out can be obtained by reading three times.

As another structure of the pixel 206, the pixel 206 may be formed to include the first sub pixel 211 with the first light-emitting element exhibiting red emission, the second sub pixel 212 with the second light-emitting element exhibiting green emission, the third sub pixel 213 with the third light-emitting element exhibiting blue emission, the fourth sub pixel 214 with the image pick-up element, a fifth sub pixel 215 with a second image pick-up element, and a six sub pixel 216 with a third image pick-up element (FIG. 4C). Each of the first to sixth sub pixels 211 to 216 includes a thin film transistor for controlling the light-emitting element or the image pick-up element.

Each of a pair of the first sub pixel 211 and the fourth sub pixel 214, a pair of the second sub pixel 212 and the fifth sub pixel 215, and a pair of the third sub pixel 213 and the sixth sub pixel 216 is provided so as to neighbor each other. Further, the total area of the first sub pixel 211 and the fourth sub pixel 214, the total area of the second sub pixel 212 and the fifth sub pixel 215, and the total area of the third sub pixel 213 and the sixth sub pixel 216 are the same or approximately the same magnitude.

In the case of having the foregoing structure, the first to third sub pixels 211 to 213 are lightened simultaneously to read out information on the object to be read by the fourth to sixth sub pixels 214 to 216. The fourth sub pixel 214 receives reflected light generated in the first sub pixel 211, the fifth sub pixel 215 receives reflected light generated in the second sub pixel 212, and the sixth sub pixel 216 receives reflected light generated in the third sub pixel 213. In this structure, colored information on the object to be read out can be obtained by reading once. The "reflected light" described herein refers to light that is generated in the light-emitting element and reflected by the surface of the object to be read.

Figure 5C:
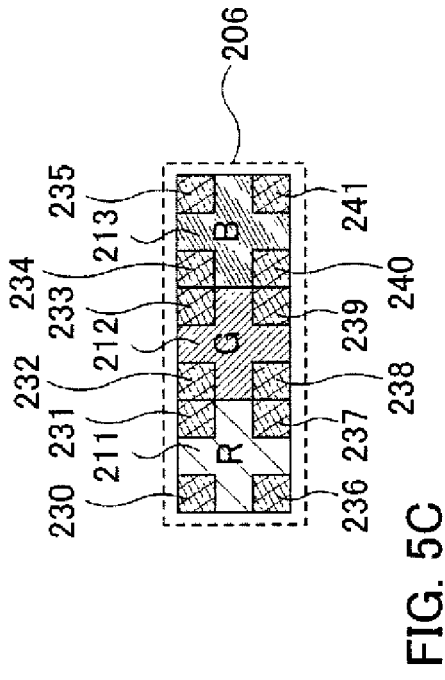
FIGS. 5A to 5D are explanatory views for showing a structure of a display device mounted with a read function according to the present invention.
Figure 5D:
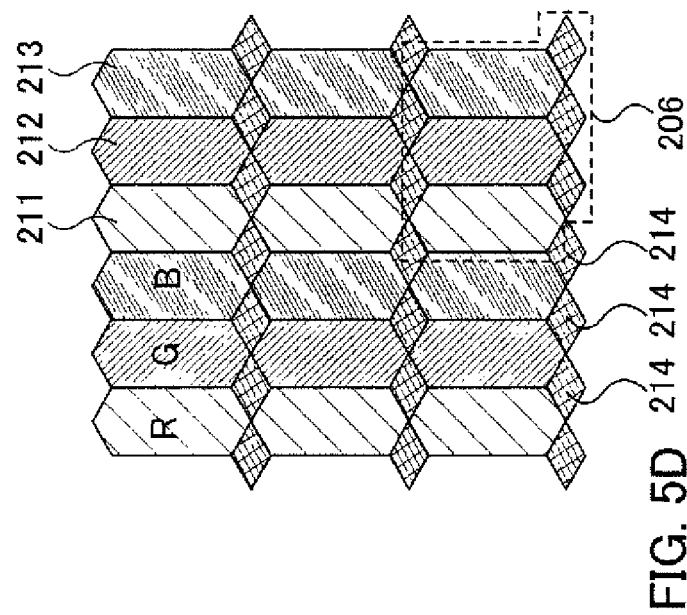
Figure 5A:
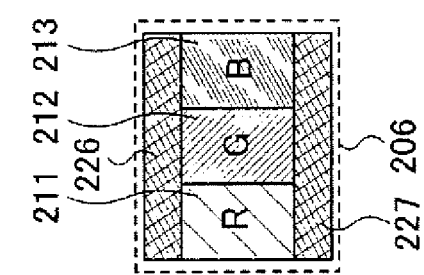

As more another structure of the pixel 206, the pixel 206 may be formed to include the first to third sub pixel 211 to 213 having light-emitting elements, and the sub pixels 226, 227 having image pick-up elements (FIG. 5A). The sub pixels 226, 227 receive reflected light of the first to third sub pixels 211 to 213. In this structure, colored information on the object to be read can be obtained by reading three times.

Figure 5B:
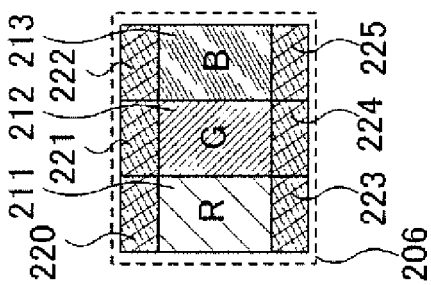

As further more another structure of the pixel 206, the pixel 206 may be formed to include the first to third sub pixel 211 to 213 having light-emitting elements, and the sub pixels 220 to 225 having image pick-up elements (FIG. 5B). The sub pixels 220, 223 receive the reflected light of the first sub pixel 211, the sub pixels 221, 224 receive the reflected light of the second sub pixel 212, and the sub pixels 222, 225 receive the reflected light of the third sub pixel 213. In this structure, colored information on the object to be read out can be obtained by reading once.

As still further structure of the pixel 206, the pixel 206 may be formed to include the first to third sub pixel 211 to 213 having light-emitting elements, and the sub pixels 230 to 241 having image pick-up elements (FIG. 5C). The sub pixels 230, 231, 236, and 237 receive the reflected light of the first sub pixel 211, the sub pixels 232, 233, 238, and 239 receive the reflected light of the second sub pixel 212, and the sub pixels 234, 235, 240, and 241 receive the reflected light of the third sub pixel 213. In this structure, colored information on the object to be read out can be also obtained by reading once.

The foregoing pixel 206 is formed into a rectangular shape. However, the present invention is not limited to the shape. For example, the pixel 206 may be formed into a polygonal shape such as a hexagonal shape (FIG. 5D) or into a circular shape.

In the foregoing, the case that the first to third sub pixels 211 to 213 include light-emitting elements emitting light of red, green, or blue is explained; however, the present invention is not limited to the explained case. For example, the first sub pixel 211 may have a white light-emitting element and a red coloring layer or alternatively, have a light-emitting element exhibiting blue emission and a color conversion layer, since the first sub pixel 211 may emit red emission outside. The second sub pixel 212 may have a white light-emitting element and a green coloring layer, or alternatively have a blue light-emitting element and a color conversion layer, since the second sub pixel 212 may emit green emission outside. The third sub pixel 213 may have a white light-emitting element and a blue coloring layer, or alternatively a blue light-emitting element and a color conversion layer, since the third sub pixel 213 emit blue emission outside.

Embodiment 2

As noted above, a pixel 206 included in a display device mounted with a read function according to the present invention has a plurality of sub pixels composed of at least one sub pixel with a light-emitting element and one sub pixel with an image pick-up element. Hereinafter, the structure of the display device mounted with a read function characterized in varying the area of the sub pixel provided over a substrate.

The first structure of the display device mounted with a read function is explained with reference to the drawings. The pixel 206 may be formed to include a first sub pixel 211 with a light-emitting element exhibiting red emission, a second sub pixel 212 with a light-emitting element exhibiting green emission, a third sub pixel 213 with a light-emitting element exhibiting blue emission, and a fourth sub pixel 214 with an image pick-up element (FIGS. 6A to 6E). Over the substrate, the area of the first sub pixel 211 is the same or approximately the same as that of the third sub pixel 213, and the total area of the second sub pixel 212 and the fourth sub pixel 214 is the same or approximately the same as that of the first sub pixel 211 or the third sub pixel 213.

Figure 6C:
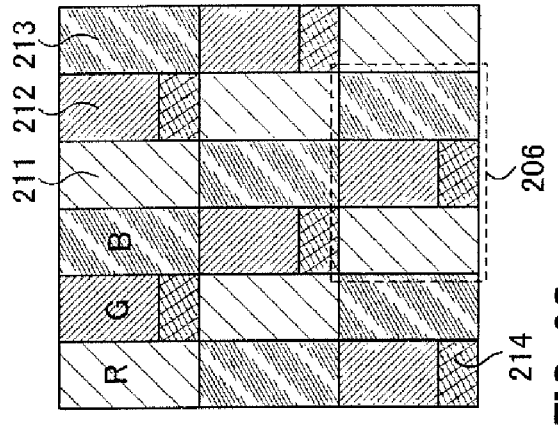
FIGS. 6A to 6E are explanatory views for showing a structure of a display device mounted with a read function according to the present invention.
Figure 6B:
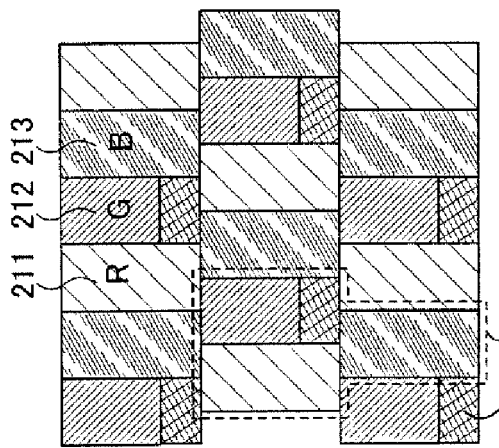
Figure 6E:
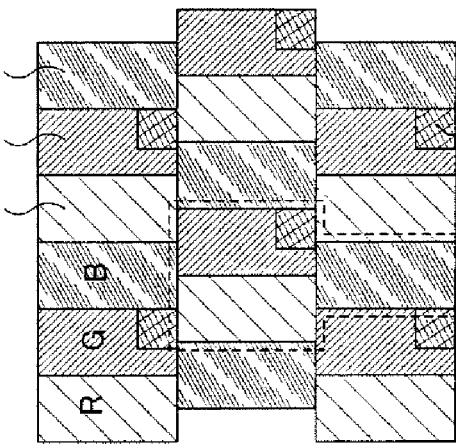
Figure 6A:
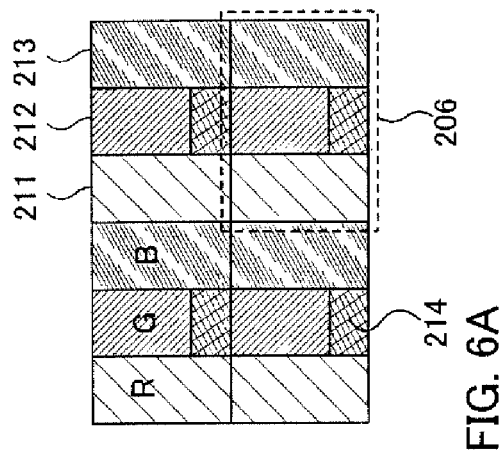
Figure 6D:
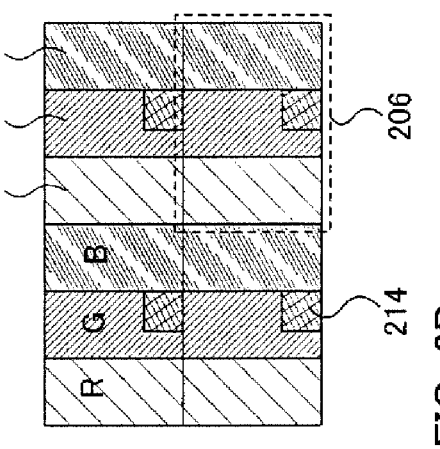

The area ratio between the second sub pixel 212 and the fourth sub pixel 214 may be 3:1 (FIGS. 6A to 6C) or 5:1 (FIGS. 6D and 6E). The area ratio may be set in accordance with the current density of light-emitting materials of red, green, and blue so that luminance variation of each color is improved. The areas of the second sub pixel 212 and the fourth sub pixel 214 may be divided horizontally (FIGS. 6A to 6C) or vertically. The arrangement of the first to fourth sub pixels 211 to 214 included in the pixel 206 may be selected from stripe arrangement, that is, stripe arrangement composed of sets of sub pixels corresponding to red, green, and blue arranged so that each color is observed as stripes (FIG. 6A, 6D), delta arrangement composed of sets of sub pixels corresponding to red, green, and blue alternatively moved to half pitches (FIGS. 6B, 6E), or mosaic arrangement composed of sets of sub pixels corresponding to red, green, and blue arranged so that each color is observed diagonal lines (FIG. 6C). The stripe arrangement is suitable to display lines, figures, or characters, and so preferably used for a monitor. The mosaic arrangement can provide more natural images than that of the stripe arrangement, and so preferably used for a television apparatus. Further, the delta arrangement can also provide natural images, and so preferably used for a television apparatus or the like.

Then, the second structure is explained with reference to the drawings. The pixel 206 has the first sub pixel 211 with the light-emitting element exhibiting red emission, the second sub pixel 212 with the light-emitting element exhibiting green emission, the third sub pixel 213 with the light-emitting element exhibiting blue emission, and the fourth sub pixel 214 with the image pick-up element (FIGS. 7A to 7E). The total area of the first sub pixel 211, the third sub pixel 213, and the fourth sub pixel 214 is twice or schematically twice as large as that of the second sub pixel 212.

The area ratio among the first sub pixel 211, the third sub pixel 213, and the fourth sub pixel 214 may be, for example, 1:1:1 (FIG. 7A to 7C). Alternatively, the area ratio may be 5:4:3 (FIGS. 7D, 7E). The area ratio may be determined in accordance with the current density of the light-emitting material of red, green, and blue in order to improve the variation of luminance in each color. The arrangement of the first to fourth sub pixels 211 to 214 may adopt any kinds of arrangement of a stripe arrangement (FIGS. 7A, 7D), a delta arrangement (FIGS. 7B, 7E), and a mosaic arrangement (FIG. 7C).

As noted above, the present invention is characterized in varying the area of the sub pixel including the light-emitting element over the substrate. By the virtue of this characteristic, the variation of luminance in each color and the white balance can be improved by varying the emitting area even when the current densities of the light-emitting material of red, green, and blue are different from each other. An extra sub pixel including an image pick-up element is not provided, but the area of a sub pixel including a light-emitting element is reduced to improve white balance. Subsequently, an image pick-up element is provided in a region produced by reducing the area of the sub pixel. Therefore, integration degree as much as that in the case of not including the image pick-up element can be kept even if the sub pixel including an image pick-up element is provided, and so high-definition images can be displayed. This embodiment can be freely combined with the foregoing embodiments.

Example 1

A pixel 206 included in a display device mounted with a read function according to the present invention has a plurality of sub pixels composed of one sub pixel having at least a light-emitting element and one sub pixel having an image pick-up element. Here, an example of an equivalent circuit of the pixel 206 is explained with reference to the drawings.

Figure 8:
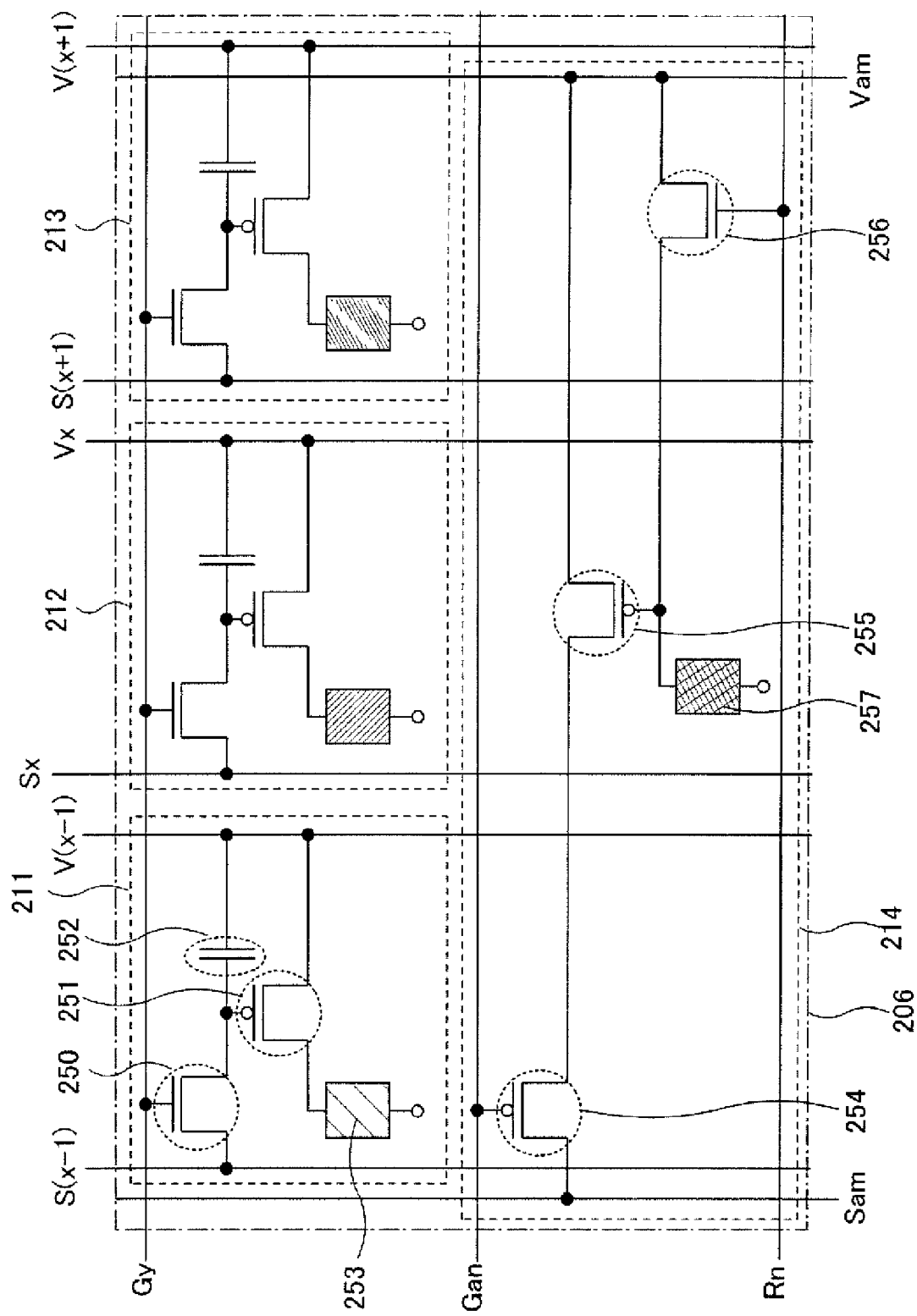
FIG. 8 is an explanatory view for showing a structure of a display device mounted with a read function according to the present invention.

Firstly, the equivalent circuit in the case that the pixel 206 has a first sub pixel 211 having a first light-emitting element exhibiting red emission, a second sub pixel 212 having a second light-emitting element exhibiting green emission, a third sub pixel 213 having a third light-emitting element exhibiting blue emission, and a fourth sub pixel 214 having an image pick-up element is explained (FIG. 8).

Each of the first sub pixel 211 to the third sub pixel 213 has a switch transistor 250, a drive transistor 251, a capacitor element 252, and a light-emitting element 253 in a region surrounded by a source line Sx (x is a natural number), a power source line Vx, and a gate line Gy (y is a natural number). The switching transistor 250 is a transistor for controlling the input of a video signal to the sub pixel having either the conductivity of N-type or P-type. The driver transistor 251 is a transistor for controlling a current value flowing through the light-emitting element 253 having either the conductivity of N-type or P-type. The capacitor element 252 serves to hold a video signal inputted to the sub pixel. In the structure shown in the drawing, the switching transistor 250 has the conductivity of N-type, whereas the driving transistor 251 has the conductivity of P-type.

The fourth sub pixel 214 has a selection transistor 254, an amplification transistor 255, a reset transistor 256, and an image pick-up element 257 in a region surrounded by a source line Sam (m is a natural number), a reset line Rn (n is a natural number), a power source line Vam, and a gate line Gan. The reset transistor 256 is a transistor for resetting potential difference between the region of one end of the image pick-up element 257 and the region of the other end of the image pick-up element 257. The amplification transistor is a transistor for amplifying a signal that is read out by the image pick-up element 257. The selection transistor 254 controls the supply of a signal that is read out by the image pick-up element 257 to a sensor source driver. In the structure shown in the drawing, the selection transistor 254 and the amplification transistor 255 has the conductivity of P-type, whereas the reset transistor 256 has the conductivity of N-type.

Figure 9:
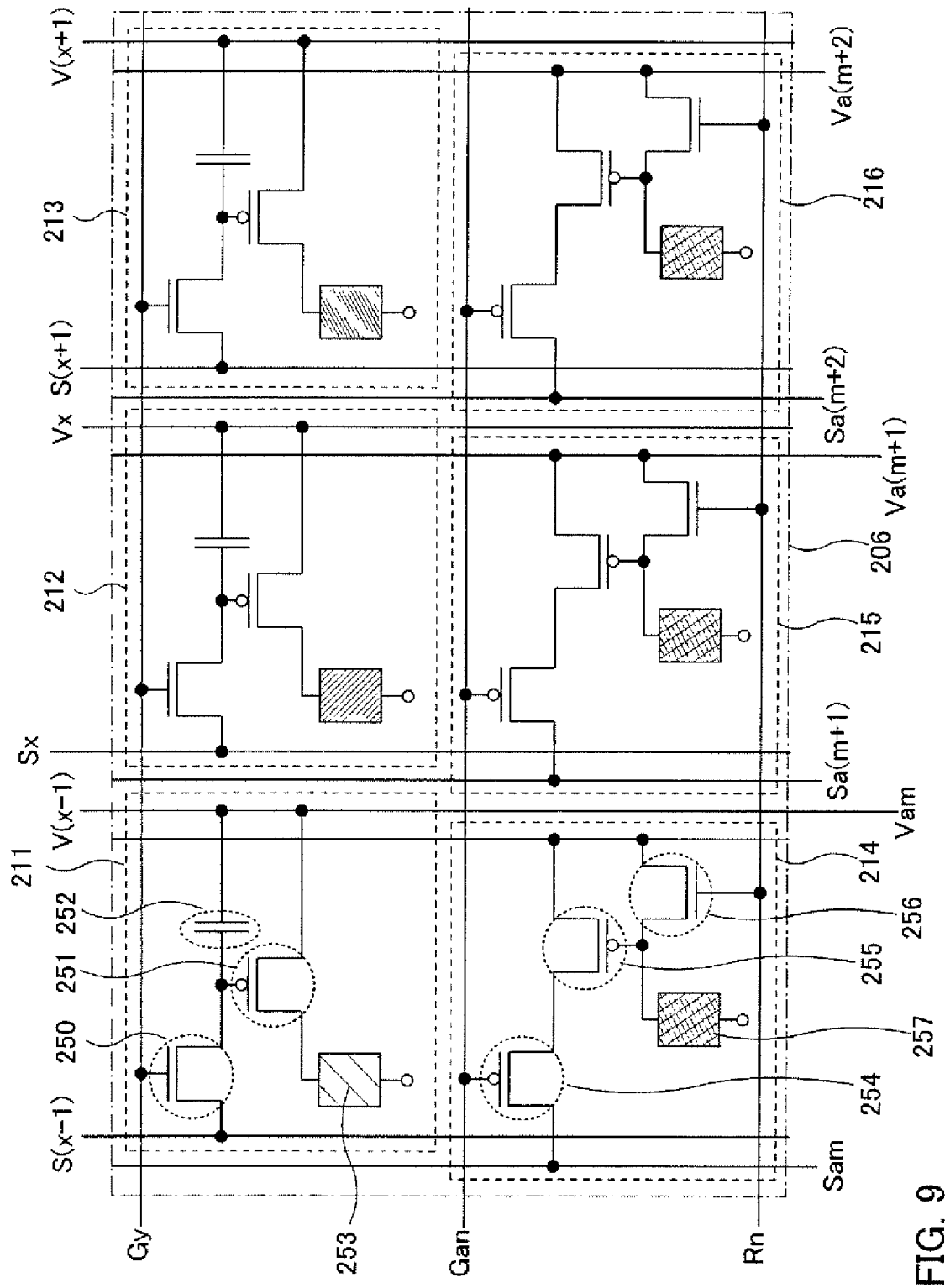
FIG. 9 is an explanatory view for showing a structure of a display device mounted with a read function according to the present invention.

The case that the equivalent circuit has the first sub pixel 211 having the first light-emitting element exhibiting red emission, the second sub pixel 212 having the second light-emitting element exhibiting green emission, the third sub pixel 213 having the third light-emitting element exhibiting blue emission, and the fourth sub pixel 214 having a first image pick-up element, a fifth sub pixel 215 having a second image pick-up element, and a sixth sub pixel 216 having a third image pick-up element is explained (FIG. 9).

In that case, as with the structure of the foregoing pixel, each of the first sub pixel 211 to the third sub pixel 213 has the switch transistor 250, the drive transistor 251, the capacitor element 252, and the light-emitting element 253, and each of the fourth sub pixel 214 to the sixth sub pixel 216 has the selection transistor 254, the amplification transistor 255, the reset transistor 256, and the image pick-up transistor 257. This example can be freely combined to the foregoing embodiments.

Example 2

In this example, the structure of a panel that is one embodiment of a display device mounted with a read function is explained with reference to the drawings. The panel has a source driver 202, a gate driver 203, a sensor source driver 204, a sensor gate driver 205, a pixel region 207 provided with a plurality of pixels in a matrix configuration, a connecting film 401, an opposing substrate 143 that is opposed to a substrate 101 having an insulating surface over the substrate 101 (FIG. 10A). The connecting film 401 is connected to an external IC chip.

FIG. 10B is a cross-sectional view of FIG. 10A taken along line A-B for showing an image pick-up element 405, a light-emitting element 406, and a driver transistor 407, each of which is provided to a pixel region 207; and a CMOS element 404 provided to the source driver 202. Further, the cross-sectional structure of the element provided to the sensor source driver 204 is not illustrated in FIG. 10B.

Sealant 403 is provided so as to surround the pixel region 207 and the foregoing four drivers to bond the substrate 101 to the opposing substrate 143. The process is a process of protecting the light-emitting element 406 from moisture. Here, a sealing method using a cover member (glass, ceramics, plastic, metal, or the like) is used. Alternatively, a sealing method using thermal curing resin or ultraviolet curing resin, or a sealing method using a thin film having high barrier function such as metal oxide or nitride can be used.

Since the element over the substrate 101 is made of a crystalline semiconductor (polysilicon) having excellent characteristics such as mobility, it can be realized that the element is formed to be monolithic. Therefore, the number of the connecting external ICs can be reduced, and so the element can be formed to be small, lightweight, and thin-shaped.

Further, a touch panel function can be provided to the display device mounted with a read function according to the present invention. The touch panel is operated by using an input pen 402 to reflect light from the pen tip of the input pen 402. That is, light generated in the light-emitting element 406 is reflected off the pen tip of the input pen 402, and the reflected light is entered into the image pick-up element 405, then, the position indicated by the input pen 402 can be recognized.

There is the conventional device mounted with a touch panel using a resistance film. In this system, the resistance film is required to be provided over the surface of the display screen. Accordingly, user views an image via the resistance film, which may lead the deterioration of the luminance of the image. Further, the device becomes deformed to be destroyed with time, that is, the device has a problem with the durability. Even if the device is not destroyed, there may arise a problem in detection accuracy of pen-based input due to the deformation. However, in the case that a touch panel function is provided to the display device mounted with a read function according to the present invention, a sharp image can be displayed without detracting from the luminance of the displayed image. Further, the display device according to the present invention can remain being superior in durability and detection accuracy. This example can be freely combined with the foregoing embodiments and examples.

Example 3

In this embodiment, electric appliances including a display device mounted with a read function according to the present invention is explained with reference to the drawing. As electric appliances having pixel regions including light-emitting elements, a television apparatus (also referred to as a television or television receiver), a digital camera, a digital video camera, a cellular phone unit (also referred to as a cellular phone handset or cellular phone), a personal digital assistant such as PDA, a portable game machine, a monitor for a computer, a sound reproduction device such as a car audio, a domestic game machine, and the like can be nominated. Specific examples of the foregoing electric appliances are explained with reference to FIGS. 11A to 11F.

Figure 11A:
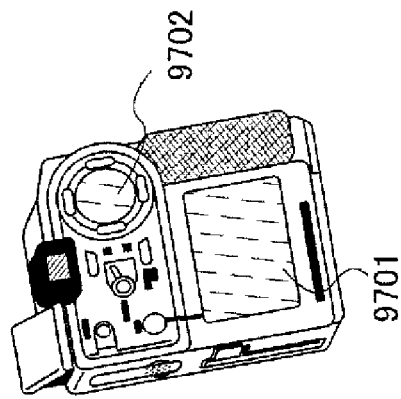
FIGS. 11A to 11F are explanatory views for showing electric appliances.

The cellular phone includes a display portion mounted with a read function 9102 (FIG. 11A). The display portion mounted with a read function described in Embodiments 1 and 2 can be applied to the display portion mounted with a read function 9102.

Figure 11D:
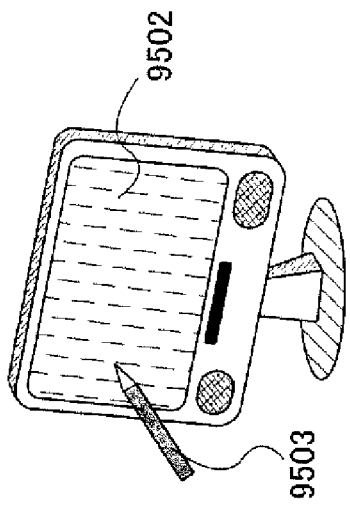
Figure 11B:
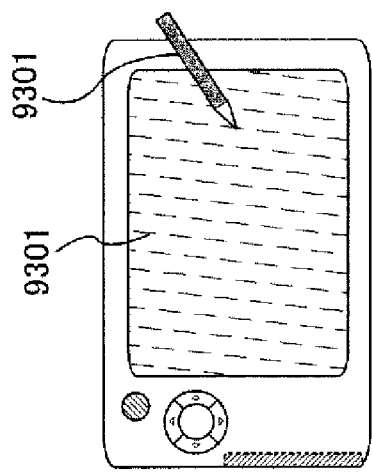

The personal digital assistant includes a display portion mounted with a read function 9301, an input pen 9302, and the like (FIG. 11B). The display portion mounted with a read function described in Embodiments 1 and 2 can be applied to the display portion mounted with a read function 9301.

Figure 11E:
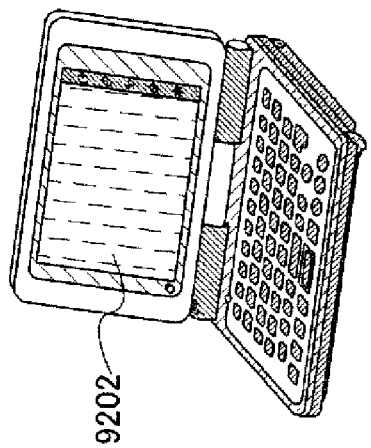
Figure 11C:
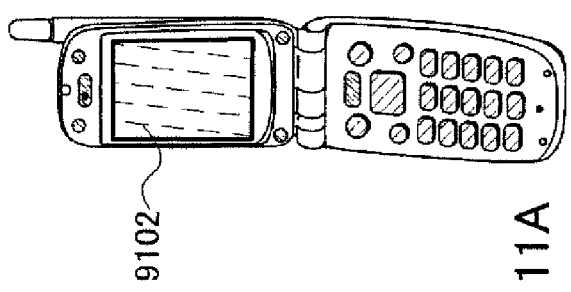

The digital video camera includes display portions mounted with read functions 9701, 9702, and the like (FIG. 11C). The display portion mounted with a read function described in Embodiments 1 and 2 can be applied to the display portions mounted with read functions 9701, 9702.

The portable game machine includes a display portion mounted with a read function 9402 and the like (FIG. 11D). The display portion mounted with a read function described in Embodiments 1 and 2 can be applied to the display portion mounted with a read function 9402.

Another personal digital assistant includes a display portion mounted with a read function 9202 and the like (FIG. 11E). The display portion mounted with a read function described in Embodiments 1 and 2 can be applied to the display portion mounted with a read function 9202.

Figure 11F:
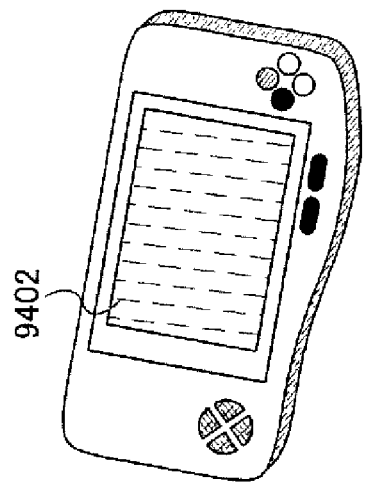

The monitor device includes a display portion mounted with a read function 9502, an input pen 9503, and the like (FIG. 11F). The display portion mounted with a read function described in Embodiments 1 and 2 can be applied to the display portion mounted with a read function 9502.

By applying the display device mounted with a read function according to the present invention, not only a display function but also a read function can be provided. Therefore, a sophisticated and value-added electric appliance can be provided. Moreover, a touch panel function can be added by providing an input pen, an increasingly sophisticated and value-added electric appliance can be provided.

Example 4

A display device mounted with a read function according to the present invention has two functions of a display function and a read function. In this example, a switching system of both of the functions is explained with reference to the drawings.

The power of the display device mounted with a read function is turned on to be started (FIG. 12A). After starting, the display device is turned into a display mode automatically, a display portion is turned on, and a sensor portion is turned off. The display portion described herein is equivalent to a sub pixel having a light-emitting element and a driver for controlling the sub pixel. The sensor portion is equivalent to a sub pixel having an image pick-up element and a driver for controlling the sub pixel.

When moving from the display mode to a read out mode, a button, an input pen, and the like provided to the display device are used. In the read out mode, both of the display portion and the sensor portion are turned on. When moving from the read out mode to the display mode, the button, the input pen, and the like provided to the display device are used.

The display device mounted with a read function according to the present invention is suitable for a personal digital assistant such as a PDA or a cellular phone. For example, a business card is put over a display screen after changing to the read out mode, the display device reads out an image quickly (FIG. 12B), and the read out image can be displayed on the display screen after changing from the read out mode to the display mode (FIG. 12C).

As an object to be read out, not only the business card, but also biological information on living body such as a fingerprint can be read out. In the case that the biological information can be read out, authentication can be operated. For example, a finger is pressed to the screen of the personal digital assistant, and the information on the fingerprint is read out (FIGS. 13A and 13B). The information on the fingerprint is, specifically, information on a bifurcation point and a corner point (FIG. 13C). When the read out of the bifurcation point and the corner point of the fingerprint is terminated, the information is checked against information on the fingerprint that is preliminarily stored in a data base (FIG. 13D). In the other example, when the read out of the bifurcation point and the corner point of the fingerprint is terminated, the ID number is inputted in the same time. According to the ID number, personal information on the fingerprint stored in a data base is identified. The read out fingerprint information is checked against the identified fingerprint information (FIG. 13D). By using the above mentioned personal recognition function, anyone else can be prevented from using one's own portable terminal, and electronic commerce can be carried out using a portable terminal.

This application is based on Japanese Patent Application serial no. 2000-210103 filed in Japan Patent Office on 16, 2004 Jul. the contents of which are hereby incorporated by reference.

Although the present invention has been fully described by way of examples with reference to the accompanying drawings, it is to be understood that various changes and modifications will be apparent to those skilled in the art. Therefore, unless otherwise such changes and modifications depart from the scope of the present invention hereinafter described, they should be construed as being included therein.

What is claimed is:
1. A display device comprising:
a substrate having an insulating surface;
a plurality of pixels, wherein each of the plurality of pixels comprising:
a first transistor over the substrate;
a second transistor over the substrate;
an image pick-up element over the substrate, electrically connected to the second transistor; and
a light emitting element electrically connected to the first transistor;
an insulating layer; and
a light-shielding layer over the insulating layer,
wherein the insulating layer is formed under the light emitting element, and formed over the first transistor, the second transistor and the image pick-up element, and
wherein the light-shielding layer having openings over the light emitting element and over the image pick-up element.

2. A display device comprising:
a substrate having an insulating surface;
a plurality of pixels, wherein each of the plurality of pixels comprising:
a first transistor over the substrate;
a second transistor over the substrate;
an image pick-up element over the substrate, electrically connected to the second transistor;
a light emitting element electrically connected to the first transistor;
a coloring layer over the light emitting element;
an insulating layer; and
a light-shielding layer over the insulating layer,
wherein the insulating layer is formed under the light emitting element, and formed over the first transistor, the second transistor and the image pick-up element, and
wherein the light-shielding layer having openings over the light emitting element and over the image pick-up element.

3. A display device comprising:
a substrate having an insulating surface;
a plurality of pixels, wherein each of the plurality of pixels comprising:
a first transistor over the substrate;
a second transistor over the substrate;
a third transistor over the substrate;
a fourth transistor over the substrate;
a image pick-up element over the substrate, electrically connected to the fourth transistor;
a first light emitting element electrically connected to the first transistor;
a second light emitting element electrically connected to the second transistor;
a third light emitting element electrically connected to the third transistor;
a insulating layer; and
a light-shielding layer over the insulating layer;
wherein the insulating layer is formed under the first light emitting element, the second light emitting element and the third light emitting element, and formed over the first transistor, the second transistor, the third transistor, the fourth transistor and the image pick-up element, and
wherein the light-shielding layer having openings over the first light emitting element, over the second light emitting element, over the third light emitting element and over the image pick-up element.

4. A display device comprising:
a substrate having an insulating surface;
a plurality of pixels, wherein each of the plurality of pixels comprising:
a first transistor over the substrate;
a second transistor over the substrate;
a third transistor over the substrate;
a fourth transistor over the substrate;

a image pick-up element over the substrate, electrically connected to the fourth transistor;
a first light emitting element electrically connected to the first transistor;
a second light emitting element electrically connected to the second transistor;
a third light emitting element electrically connected to the third transistor;
a first coloring layer over the first light emitting element;
a second coloring layer over the second light emitting element; and
a third coloring layer over the third light emitting element,
a insulating layer; and
a light-shielding layer over the insulating layer;
wherein the insulating layer is formed under the first light emitting element, the second light emitting element and the third light emitting element, and formed over the first transistor, the second transistor, the third transistor, the fourth transistor and the image pick-up element, and
wherein the light-shielding layer having openings over the first light emitting element, over the second light emitting element, over the third light emitting element and over the image pick-up element.

5. A display device comprising:
a substrate having an insulating surface;
a plurality of pixels, wherein each of the plurality of pixels comprising:
a first transistor over the substrate;
a second transistor over the substrate;
a third transistor over the substrate;
a fourth transistor over the substrate;
a fifth transistor over the substrate;
a sixth transistor over the substrate;
a first image pick-up element over the substrate, electrically connected to the fourth transistor;
a second image pick-up element over the substrate, electrically connected to the fifth transistor;
a third image pick-up element over the substrate, electrically connected to the sixth transistor;
a first light emitting element electrically connected to the first transistor;
a second light emitting element electrically connected to the second transistor;
a third light emitting element electrically connected to the third transistor;
a insulating layer; and
a light-shielding layer over the insulating layer;
wherein the insulating layer is formed under the first light emitting element, the second light emitting element and the third light emitting element, and formed over the first transistor, the second transistor, the third transistor, the fourth transistor, the fifth transistor, the sixth transistor, the first image pick-up element, the second image pick-up element and the third image pick-up element, and
wherein the light-shielding layer having openings over the first light emitting element, over the second light emitting element, over the third light emitting element, over the first image pick-up element, over the second image pick-up element and over the third image pick-up element.

6. A display device comprising:
a substrate having an insulating surface;
a plurality of pixels, wherein each of the plurality of pixels comprising:
a first transistor over the substrate;
a second transistor over the substrate;
a third transistor over the substrate;
a fourth transistor over the substrate;
a fifth transistor over the substrate;
a sixth transistor over the substrate;
a first image pick-up element over the substrate, electrically connected to the fourth transistor;
a second image pick-up element over the substrate, electrically connected to the fifth transistor;
a third image pick-up element over the substrate, electrically connected to the sixth transistor;
a first light emitting element electrically connected to the first transistor;
a second light emitting element electrically connected to the second transistor;
a third light emitting element electrically connected to the third transistor;
a first coloring layer over the first light emitting element;
a second coloring layer over the second light emitting element; and
a third coloring layer over the third light emitting element,
a insulating layer; and
a light-shielding layer over the insulating layer;
wherein the insulating layer is formed under the first light emitting element, the second light emitting element and the third light emitting element, and formed over the first transistor, the second transistor, the third transistor, the fourth transistor, the fifth transistor, the sixth transistor, the first image pick-up element, the second image pick-up element and the third image pick-up element, and
wherein the light-shielding layer having openings over the first light emitting element, over the second light emitting element, over the third light emitting element, over the first image pick-up element, over the second image pick-up element and over the third image pick-up element.

7. The display device according to claim 1, wherein the image pick-up element includes a crystalline semiconductor.

8. The display device according to claim 2, wherein the image pick-up element includes a crystalline semiconductor.

9. The display device according to claim 3, wherein the image pick-up element includes a crystalline semiconductor.

10. The display device according to claim 4, wherein the image pick-up element includes a crystalline semiconductor.

11. The display device according to claim 5, wherein each of the first image pick-up element, the second image pick-up element and the third image pick-up element includes crystalline semiconductors.

12. The display device according to claim 6, wherein each of the first image pick-up element, the second image pick-up element and the third image pick-up element includes crystalline semiconductors.

13. The display device according to claim 1, wherein the image pick-up element is a photovoltaic element.

14. The display device according to claim 2, wherein the image pick-up element is a photovoltaic element.

15. The display device according to claim 3, wherein the image pick-up element is a photovoltaic element.

16. The display device according to claim 4, wherein the image pick-up element is a photovoltaic element.

17. The display device according to claim 5, wherein each of the first image pick-up element, the second image pick-up element and the third image pick-up element is a photovoltaic element.

18. The display device according to claim 6, wherein each of the first image pick-up element, the second image pick-up element and the third image pick-up element is a photovoltaic element.

19. The display device according to claim 1, wherein the image pick-up element is a photoconductive element.

20. The display device according to claim 2, wherein the image pick-up element is a photoconductive element.

21. The display device according to claim 3, wherein the image pick-up element is a photoconductive element.

22. The display device according to claim 4, wherein the image pick-up element is a photoconductive element.

23. The display device according to claim 5, wherein each of the first image pick-up element, the second image pick-up element and the third image pick-up element is a photoconductive element.

24. The display device according to claim 6, wherein each of the first image pick-up element, the second image pick-up element and the third image pick-up element is a photoconductive element.

25. The display device according to claim 1, wherein the light-shielding layer comprises any one of a carbon particle, a metal particle, a pigment and a coloring material.

26. The display device according to claim 2, wherein the light-shielding layer comprises any one of a carbon particle, a metal particle, a pigment and a coloring material.

27. The display device according to claim 3, wherein the light-shielding layer comprises any one of a carbon particle, a metal particle, a pigment and a coloring material.

28. The display device according to claim 4, wherein the light-shielding layer comprises any one of a carbon particle, a metal particle, a pigment and a coloring material.

29. The display device according to claim 5, wherein the light-shielding layer comprises any one of a carbon particle, a metal particle, a pigment and a coloring material.

30. The display device according to claim 6, wherein the light-shielding layer comprises any one of a carbon particle, a metal particle, a pigment and a coloring material.

31. An electric appliance having the display device according to any one of claim 1.

32. An electric appliance having the display device according to any one of claim 2.

33. An electric appliance having the display device according to any one of claim 3.

34. An electric appliance having the display device according to any one of claim 4.

35. An electric appliance having the display device according to any one of claim 5.

36. An electric appliance having the display device according to any one of claim 6.

* * * * *